United States Patent
Kwon et al.

(10) Patent No.: US 9,672,933 B2
(45) Date of Patent: Jun. 6, 2017

(54) THRESHOLD BASED MULTI-LEVEL CELL PROGRAMMING FOR A NON-VOLATILE MEMORY DEVICE

(71) Applicant: Samsung Electronics Co., Ltd., Suwon-si, Gyeonggi-do (KR)

(72) Inventors: Joon-Soo Kwon, Seoul (KR); Sang-Soo Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/733,583

(22) Filed: Jun. 8, 2015

(65) Prior Publication Data
US 2016/0042803 A1    Feb. 11, 2016

(30) Foreign Application Priority Data
Aug. 6, 2014    (KR) .................. 10-2014-0100772

(51) Int. Cl.
*G11C 16/34*    (2006.01)
*G11C 16/10*    (2006.01)
*G11C 11/56*    (2006.01)
*G11C 16/04*    (2006.01)

(52) U.S. Cl.
CPC ...... *G11C 16/3459* (2013.01); *G11C 11/5628* (2013.01); *G11C 11/5671* (2013.01); *G11C 16/0483* (2013.01); *G11C 16/10* (2013.01); *G11C 2211/5621* (2013.01)

(58) Field of Classification Search
CPC .................................................. G11C 16/3459
USPC ........................................................ 365/185.03
See application file for complete search history.

(56) References Cited

U.S. PATENT DOCUMENTS

| | | | |
|---|---|---|---|
| 7,405,975 B2 * | 7/2008 | Hosono | G11C 11/5628 365/185.17 |
| 7,679,133 B2 | 3/2010 | Son et al. | |
| 7,808,836 B2 | 10/2010 | Murin et al. | |
| 7,894,272 B2 * | 2/2011 | Breitwisch | G11C 11/5628 365/148 |
| 7,916,533 B2 | 3/2011 | Dong et al. | |
| 7,941,590 B2 | 5/2011 | Yang et al. | |
| 8,009,472 B2 | 8/2011 | Murin et al. | |
| 8,189,395 B2 | 5/2012 | Shiga et al. | |
| 8,305,817 B2 | 11/2012 | Park et al. | |
| 8,441,853 B2 | 5/2013 | Li | |
| 8,472,245 B2 | 6/2013 | Kim | |
| 8,509,000 B2 * | 8/2013 | Sharon | G11C 11/5642 365/185.03 |

(Continued)

*Primary Examiner* — Anthan Tran
*Assistant Examiner* — Mushfique Siddique
(74) *Attorney, Agent, or Firm* — Harness, Dickey & Pierce, P.L.C.

(57) ABSTRACT

A method of programming a memory device includes programming a low bit to a memory cell included in a word line and a bit line based on a first verification condition, the low bit belonging to a group of bits including a high bit. The first verification condition is based on at least one of a first bit line current, a first develop time for verifying the programming of the low bit, and a first word line voltage. The method includes programming the high bit to the memory cell based on a second verification condition. The second verification condition is based on at least one of a second bit line current, a second develop time for verifying the programming of the high bit, and a second word line voltage.

18 Claims, 19 Drawing Sheets

(56) References Cited

U.S. PATENT DOCUMENTS

| | | |
|---|---|---|
| 8,537,611 B2 | 9/2013 | Dutta et al. |
| 8,553,466 B2 | 10/2013 | Han et al. |
| 8,559,235 B2 | 10/2013 | Yoon et al. |
| 8,654,587 B2 | 2/2014 | Yoon et al. |
| 2005/0018488 A1* | 1/2005 | Kim .................... G11C 11/5628 365/185.28 |
| 2008/0056006 A1* | 3/2008 | Jung ................... G11C 11/5628 365/185.22 |
| 2010/0034019 A1* | 2/2010 | Kang .................. G11C 11/5628 365/185.03 |
| 2010/0246260 A1* | 9/2010 | Kang ..................... G11C 16/10 365/185.03 |
| 2011/0233648 A1 | 9/2011 | Seol et al. |
| 2013/0094292 A1* | 4/2013 | Park .................... G11C 11/5628 365/185.03 |
| 2013/0094294 A1* | 4/2013 | Kwak ................. H01L 27/1157 365/185.03 |
| 2013/0336057 A1 | 12/2013 | Chung et al. |
| 2013/0336069 A1* | 12/2013 | Kim .................... G11C 16/3459 365/185.19 |
| 2014/0010021 A1* | 1/2014 | Lee ..................... G11C 11/5642 365/185.18 |
| 2014/0047163 A1* | 2/2014 | Kwak ................. G06F 12/0246 711/103 |
| 2014/0153329 A1* | 6/2014 | Kang .................... G11C 7/1039 365/185.03 |
| 2015/0103595 A1* | 4/2015 | Dunga ............... G11C 16/3459 365/185.03 |

* cited by examiner

| | PROGRAM FOR LOW BIT (LB) | PROGRAM FOR HIGH BIT (HB) |
|---|---|---|
| R(N) | LOW | HIGH |
| VERIFICATION CONDITION | FIRST VERIFICATION CONDITION (FVC) | SECOND VERIFICATION CONDITION (SVC) |

|  | PROGRAM FOR LOW BIT | PROGRAM FOR HIGH BIT |
|---|---|---|
| R(N) | LOW | HIGH |
| VD | HIGH | LOW |
| BL PRECHARGE LEVEL | LOW | HIGH |

|  | PROGRAM FOR LOW BIT | PROGRAM FOR HIGH BIT |
|---|---|---|
| VG | LOW | HIGH |
| IBLN, N=1, 2 | LOW | HIGH |

FIG. 15

|  | PROGRAM FOR LOW BIT | PROGRAM FOR HIGH BIT |
|---|---|---|
| DEVELOP TIME | LOW | HIGH |

| | PROGRAM FOR LOW BIT | PROGRAM FOR HIGH BIT |
|---|---|---|
| VWL | LOW | HIGH |

FIG. 22

|  | PROGRAM FOR LOW BIT (LB) | PROGRAM FOR MIDDLE BIT (MB) | PROGRAM FOR HIGH BIT (HB) |
|---|---|---|---|
| R(N) | LOW | MIDDLE | HIGH |
| VD | HIGH | MIDDLE | LOW |
| BL PRECHARGE LEVEL (BLPL) | LOW | MIDDLE | HIGH |
| VERIFICATION CONDITION | FIRST VERIFICATION CONDITION (FVC) | SECOND VERIFICATION CONDITION (SVC) | THIRD VERIFICATION CONDITION (TVC) |

FIG. 23

|  | PROGRAM FOR LOW BIT | PROGRAM FOR MIDDLE BIT | PROGRAM FOR HIGH BIT |
|---|---|---|---|
| VG | LOW | MIDDLE | HIGH |
| IBL | LOW | MIDDLE | HIGH |

FIG. 24

| | PROGRAM FOR LOW BIT | PROGRAM FOR MIDDLE BIT | PROGRAM FOR HIGH BIT |
|---|---|---|---|
| DEVELOP TIME | LOW | MIDDLE | HIGH |

FIG. 25

| | PROGRAM FOR LOW BIT | PROGRAM FOR MIDDLE BIT | PROGRAM FOR HIGH BIT |
|---|---|---|---|
| VWL | LOW | MIDDLE | HIGH |

THRESHOLD BASED MULTI-LEVEL CELL PROGRAMMING FOR A NON-VOLATILE MEMORY DEVICE

CROSS-REFERENCE TO RELATED APPLICATION

This application claims priority under 35 USC §119 to Korean Patent Applications No. 10-2014-0100772, filed on Aug. 6, 2014, in the Korean Intellectual Property Office (KIPO), the contents of which are herein incorporated by reference in their entirety.

BACKGROUND

1. Technical Field

At least one example embodiment relates generally to a memory device and more particularly to a method of programming a memory device.

2. Description of the Related Art

A semiconductor memory device may be classified into two types (i.e., a volatile memory device and a non-volatile memory device) according to whether data can be preserved in a power-off state.

Recently, as an electric device is desire to consume low power and to be manufactured in a small size, a NAND flash memory device is widely used as a non-volatile memory device. The NAND flash memory device may have a small size (i.e., a high degree of integration) by using multi-level cells that store data of multiple bits, respectively. Also, research is in progress to improve the threshold voltage distribution in programming multi level cell.

SUMMARY

At least one example embodiment provides a method of programming a memory device capable of improving (or alternatively, optimizing) the threshold voltage distribution by using different verification conditions in programming for a low bit and programming for a high bit.

According to at least one example embodiment, a method of programming a memory device includes programming a low bit to a memory cell included in a word line and a bit line based on a first verification condition, the low bit belonging to a group of bits including a high bit. The first verification condition is based on at least one of a first bit line current, a first develop time for verifying the programming of the low bit, and a first word line voltage. The method includes programming the high bit to the memory cell based on a second verification condition. The second verification condition is based on at least one of a second bit line current, a second develop time for verifying the programming of the high bit, and a second word line voltage.

According to at least one example embodiment, the low bit may be programmed based on the first verification condition. The low bit that is programmed on the memory cell may be verified based on the first verification condition. The low bit may be re-programmed if the verification for the low bit fails and the verifying operation may be performed again based on the first verification condition. If the verification for the low bit succeeds, the high bit may be programmed on the memory cell based on the second verification condition.

According to at least one example embodiment, the high bit may be programmed based on the second verification condition. The high bit that is programmed on the memory cell may be verified based on the second verification condition. The high bit may be re-programmed if the verification for the high bit fails and the verifying operation may be performed again based on the second verification condition. If the verification for the high bit succeeds, the program operation for the memory cell may be finished.

According to at least one example embodiment, the first verification condition is based on the first bit line current that is transferred through the bit line, the second verification condition is based on the second bit line current that is transferred through the bit line, and an amplitude of the first bit line current is less than an amplitude of the second bit line current.

According to at least one example embodiment, the amplitude of the first bit line current and the amplitude of the second bit line current are based on a gate voltage of a control transistor included in a page buffer that is connected to the bit line. The gate voltage of the control transistor is less for providing the first bit line current than the gate voltage of the control transistor for providing the second bit line current.

According to at least one example embodiment, first verification condition is based on the first develop time, the second verification condition is based on the second develop time, and the first develop time is less than the second develop time.

According to at least one example embodiment, the first verification condition is based on the first word line voltage that is provided to the word line, the second verification condition is based on the second word line voltage that is provided to the word line, and an amplitude of the first word line voltage is less than an amplitude of the second word line voltage.

According to at least one example embodiment, the memory cell is included in a flash memory, and the flash memory includes a three-dimensional memory array.

According to at least one example embodiment, a method of programming a memory device includes programming a low bit to a memory cell included in a word line and a bit line based on a first verification condition, the low bit belonging to a group of bits including a high bit and a middle bit. The first verification condition is based on at least one of a first bit line current, a first develop time for verifying the programming of the low bit, and a first word line voltage. The method includes programming the middle bit to the memory cell based on a second verification condition, the second verification condition being based on at least one of a second bit line current, a second develop time for verifying the programming of the middle bit, and a second word line voltage. The method includes programming the high bit to the memory cell based on a third verification condition, the third verification condition being based on at least one of a third bit line current, a third develop time for verifying the programming of the high bit, and a third word line voltage.

According to at least one example embodiment, the low bit may be programmed based on the first verification condition. The low bit that is programmed on the memory cell may be verified based on the first verification condition. The low bit may be re-programmed if the verification for the low bit fails and the verifying operation may be performed again based on the first verification condition. If the verification for the low bit succeeds, the high bit may be programmed on the memory cell based on the second verification condition.

According to at least one example embodiment, the first verification condition is based on the first bit line current that is transferred through the bit line, the second verification condition is based on the second bit line current that is transferred through the bit line, the third verification condition is based on the third bit line current that is transferred through the bit line, and wherein an amplitude of the first bit line current is less than an amplitude of the second bit line current and an amplitude of the third bit line current.

According to at least one example embodiment, the amplitude of the first bit line current, the amplitude of the second bit line current and the amplitude of the third bit line current are based on a gate voltage of a control transistor included in a page buffer that is connected to the bit line. The gate voltage of the control transistor is less for providing the first bit line current than the gate voltage of the control transistor for providing the second bit line current and the gate voltage of the control transistor for providing the third bit line current.

According to at least one example embodiment, the first verification condition is based on the first develop time, the second verification condition is determined based on the second develop time, the third verification condition is determined based on the third develop time, and the first develop time is less than the second develop time and the third develop time.

According to at least one example embodiment, the first verification condition is based on the first word line voltage that is provided to the word line, the second verification condition is based on the second word line voltage that is provided to the word line, the third verification condition is based on the third word line voltage that is provided to the word line, and an amplitude of the first word line voltage is less than an amplitude of the second word line voltage and an amplitude of the third word line voltage.

According to at least one example embodiment, the memory cell is included in a flash memory, and the flash memory includes a three-dimensional memory array.

According to at least one example embodiment, a method includes verifying a first bit of data programmed to a multi-level cell of a memory using a first verification condition, the first verification condition including at least one of a first bit line current, a first verification time for verifying the first bit, and a first word line voltage. The method includes verifying a second bit of the data programmed to the multi-level cell using a second verification condition, the second verification condition including at least one of a second bit line current, a second verification time for verifying the second bit, and a second word line voltage.

According to at least one example embodiment, the memory is a flash memory, and the flash memory includes a three-dimensional memory array.

According to at least one example embodiment, the first bit line current is less than the second bit line current, the first verification time is less than the second verification time, and the first word line voltage s less than the second word line voltage.

According to at least one example embodiment, the second bit of data is a greater significant bit than the first bit of data.

A method of programming a memory device may be capable of improving (or alternatively, optimizing) the threshold voltage distribution by using different verification conditions in programming for a low bit and programming for a high bit.

BRIEF DESCRIPTION OF THE DRAWINGS

Illustrative, non-limiting example embodiments will be more clearly understood from the following detailed description taken in conjunction with the accompanying drawings.

FIG. 15 is a diagram for describing a develop time according to programming for a low bit and programming for a high bit.

FIG. 22 is a diagram for describing a bit line current according to programming for a low bit, programming for a middle bit and programming for a high bit.

FIG. 23 is a diagram illustrating a bit line current and a gate voltage according to programming for a low bit, programming for a middle bit and programming for a high bit.

FIG. 24 is a diagram for describing a develop time according to programming for a low bit, programming for a middle bit and programming for a high bit.

FIG. 25 is a diagram for describing a word line voltage according to programming for a low bit, programming for a middle bit and programming for a high bit.

DETAILED DESCRIPTION OF EXAMPLE EMBODIMENTS

Figure 1:
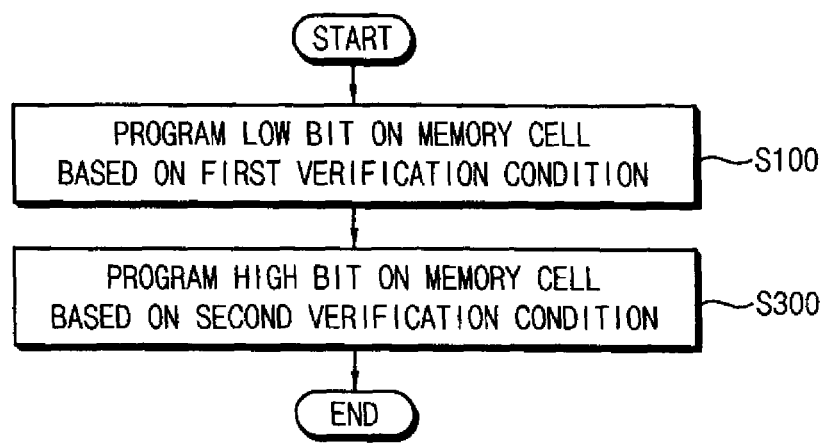
FIG. 1 is a flow chart illustrating a method of programming a memory device according to at least one example embodiment.

Inventive concepts will now be described more fully with reference to the accompanying drawings, in which example embodiments of are shown. These example embodiments are provided so that this disclosure will be thorough and complete, and will fully convey inventive concepts of to those skilled in the art. Inventive concepts may be embodied in many different forms with a variety of modifications, and a few embodiments will be illustrated in drawings and explained in detail. However, this should not be construed as being limited to example embodiments set forth herein, and rather, it should be understood that changes may be made in these example embodiments without departing from the principles and spirit of inventive concepts, the scope of which are defined in the claims and their equivalents. Like numbers refer to like elements throughout. In the drawings, the thicknesses of layers and regions are exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure example embodiments in unnecessary detail. In other instances, well-known processes, structures and techniques may be shown without unnecessary detail in order to avoid obscuring example embodiments.

In the following description, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware in existing electronic systems (e.g., electronic imaging systems, image processing systems, digital point-and-shoot cameras, personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), field programmable gate arrays (FPGAs) computers or the like.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible or non-transitory machine readable mediums for storing information. The term "computer-readable medium" may include, but is not limited to, portable or fixed storage devices, optical storage devices, and various other tangible or non-transitory mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors may be programmed to perform the necessary tasks, thereby being transformed into special purpose processor(s) or computer(s).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 2:
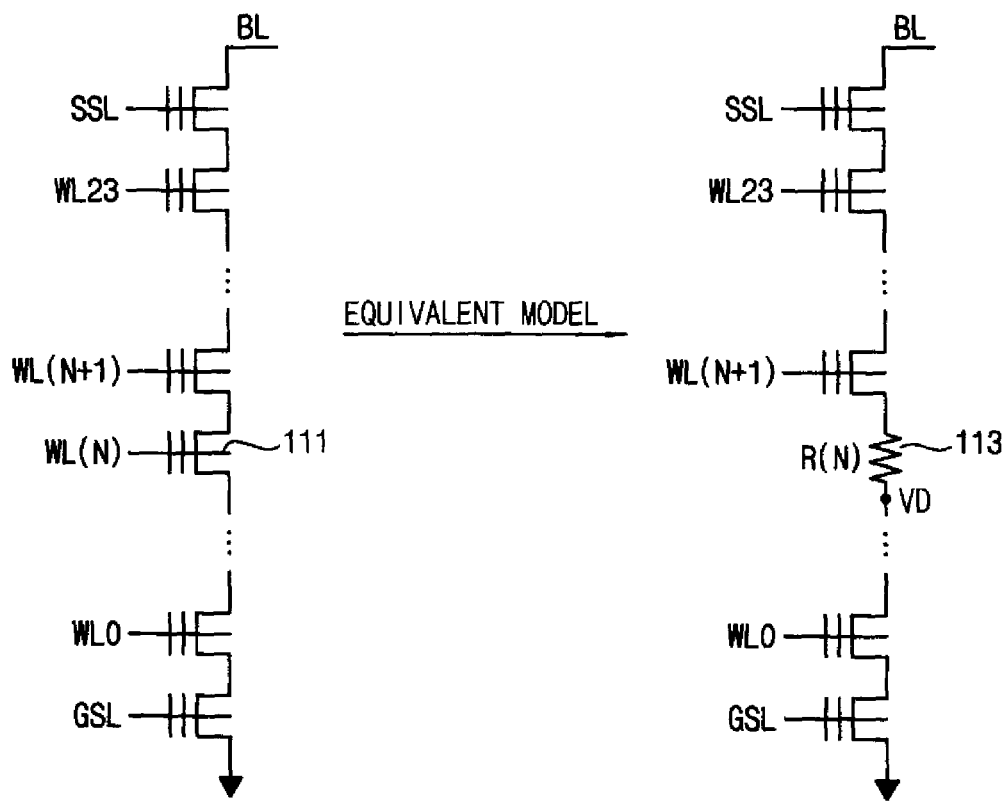
FIGS. 2 to 4 are diagrams for describing verification condition included in the method of programming the memory device of FIG. 1.
Figures 3, 4:
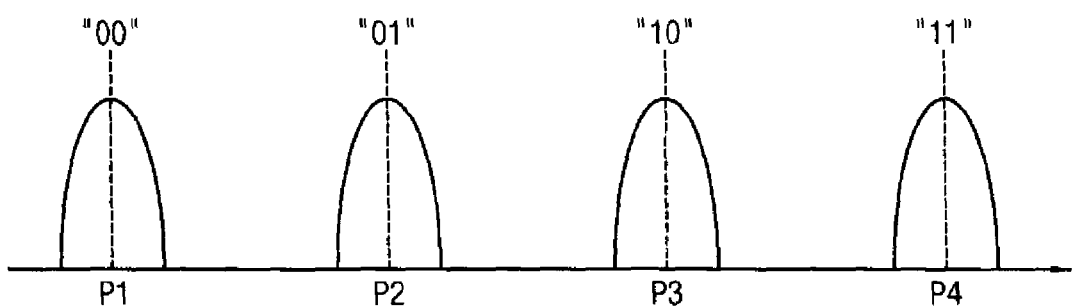

FIG. 1 is a flow chart illustrating a method of programming a memory device according to at least one example embodiment and FIGS. 2 to 4 are diagrams for describing a verification condition included in the method of programming the memory device of FIG. 1. The operations of FIG. 1 may be carried out by a memory controller (e.g., the memory controller of FIGS. 26-29 described below).

Referring to FIGS. 1 to 4, in a method of programming a memory device, a low bit (or least significant bit) LB is programmed on a memory cell 111 included in one word line WL and one bit line BL based on a first verification condition FVC (S100). The first verification condition FVC is applied to programming for the low bit LB of a high bit (or a most significant bit) HB and the low bit LB that are programmed on the memory cell 111. The high bit HB is programmed on the memory cell 111 based on a second verification condition SVC (S300). The second verification condition SVC is applied to programming for the high bit HB.

The memory cell 111 may be a multi level cell (MLC). For example, data to be programmed on the memory cell 111 may be '00', '01', '10' and '11'. For example, if the data to be programmed on the memory cell 111 is '10', the low bit LB may be '0' and the high bit HB may be '1'.

A state corresponding to '00' that is the data to be programmed on the memory cell 111 may be a first state P1. A state corresponding to '01' that is the data to be programmed on the memory cell 111 may be a second state P2. A state corresponding to '10' that is the data to be programmed on the memory cell 111 may be a third state P3. A state corresponding to '11' that is the data to be programmed on the memory cell 111 may be a fourth state P4. For example, a threshold voltage corresponding to the second state P2 may be greater than a threshold voltage corresponding to the first state P1. A threshold voltage corresponding to the third state P3 may be greater than the threshold voltage corresponding to the second state P2. A threshold voltage corresponding to the fourth state P4 may be greater than the threshold voltage corresponding to the third state P3.

An equivalent circuit of the memory cell 111 corresponding to a n-th word line WL(N) may be illustrated using a resistor. For example, if the memory cell 111 corresponding to the n-th word line WL(N) is programmed to the first state P1, the equivalent resistor R(N) of the memory cell 111 corresponding to the n-th word line WL(N) may be R1. If the memory cell 111 corresponding to the n-th word line WL(N) is programmed to the second state P2, the equivalent resistor R(N) of the memory cell 111 corresponding to the n-th word line WL(N) may be R2. If the memory cell 111 corresponding to the n-th word line WL(N) is programmed to the third state P3, the equivalent resistor R(N) of the memory cell 111 corresponding to the n-th word line WL(N) may be R3. If the memory cell 111 corresponding to the n-th word line WL(N) is programmed to the fourth state P4, the equivalent resistor R(N) of the memory cell 111 corresponding to the n-th word line WL(N) may be R4. For example, R2 may be greater than R1. R3 may be greater than R2. R4 may be greater than R3.

Therefore, the equivalent resistor R(N) of the memory cell 111 corresponding to the n-th word line WL(N) in programming the low bit LB may be less than the equivalent resistor R(N) of the memory cell 111 corresponding to the n-th word line WL(N) in programming the high bit HB. In this case, the verification condition that is used for verifying the programming for the low bit LB may be a first verification condition FVC. The verification condition that is used for verifying the programming for the high bit HB may be a second verification condition SVC. For example, the first verification condition FVC may be different from the second verification condition SVC. In another example, the first verification condition FVC may be equal to the second verification condition SVC. For example, after the high bit HB is programmed on the memory cell 111 based on a second verification condition SVC, the low bit LB may be programmed again based on a third verification condition and the high bit HB may be programmed again based on a fourth verification condition. For example, the third verification condition TVC may be different from the fourth verification condition. In another example, the third verification condition TVC may be equal to the fourth verification condition.

The verification condition may be changed according to a precharge level BLPL of the bit line BL, a develop time and/or a word line voltage VWL. The precharge level BLPL of the bit line BL may be a bit line current IBL or a bit line voltage that is provided to the bit line BL to verify the programming of the data. The develop time may be a transition time of the bit line current IBL or the bit line voltage after provision of the bit line current IBL or the bit line voltage to the bit line BL is stopped. The word line voltage VWL may be a voltage applied to the n-th word line WL(N).

The first verification condition FVC that is used for verifying the programming for the low bit LB may be different from the second verification condition SVC that is used for verifying the programming for the high bit HB. A method of programming a memory device according to at least one example embodiment may be capable of improving (or alternatively, optimizing) the threshold voltage distribution by using different verification conditions in programming for a low bit LB and in programming for a high bit HB.

Figure 5:
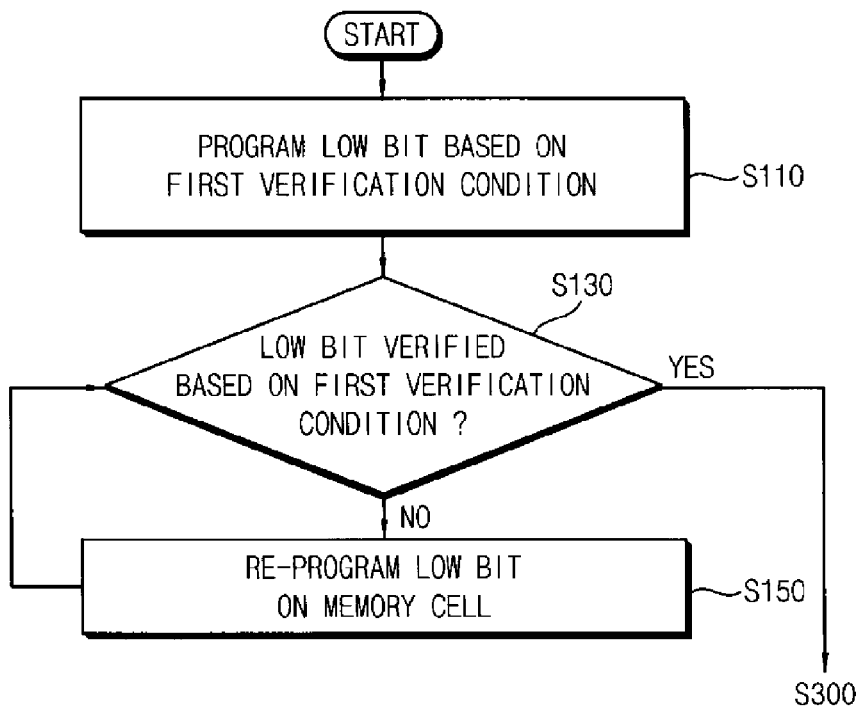
FIG. 5 is a flow chart illustrating an example of programming a low bit on a memory cell included in the method of programming the memory device of FIG. 1.
Figure 6:
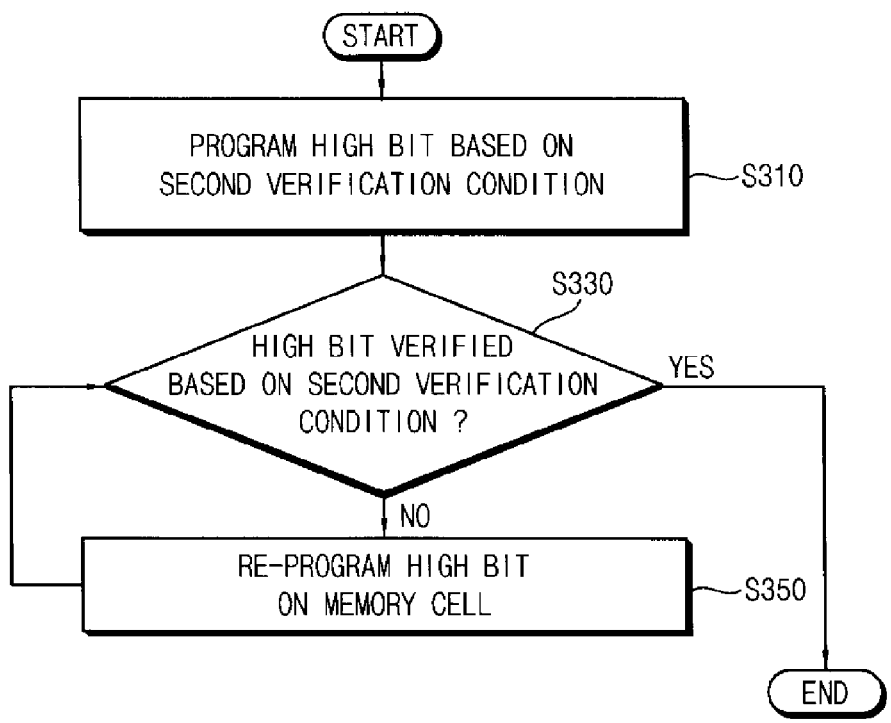
FIG. 6 is a flow chart illustrating an example of programming a high bit on a memory cell included in the method of programming the memory device of FIG. 1.

FIG. 5 is a flow chart illustrating an example of programming a low bit on a memory cell included in the method of programming the memory device of FIG. 1, and FIG. 6 is a flow chart illustrating an example of programming a high bit on a memory cell included in the method of programming the memory device of FIG. 1. The operations of FIGS. 5 and 6 may be carried out by a memory controller (e.g., the memory controller of FIGS. 26-29 described below).

Referring to FIG. 5, in programming the low bit LB on the memory cell 111 (S100), the low bit LB may be programmed based on the first verification condition FVC (S110). The low bit LB that is programmed on the memory cell 111 may be verified based on the first verification condition FVC (S130). The low bit LB may be re-programmed if the verification for the low bit LB fails (S150) and the verifying operation may be performed again based on the first verification condition FVC (S130). If the verification for the low bit LB succeeds, the high bit HB may be programmed on the memory cell 111 based on the second verification condition SVC.

Referring to FIG. 6, in programming the high bit HB on the memory cell 111 (S300), the high bit HB may be programmed based on the second verification condition SVC (S310). The high bit HB that is programmed on the memory cell 111 may be verified based on the second verification condition SVC (S330). The high bit HB may be re-programmed if the verification for the high bit HB fails (S350) and the verifying operation may be performed again based on the second verification condition SVC (S330). If the verification for the high bit HB succeeds, the program operation for the memory cell 111 may be finished.

For example, the programming for the low bit LB may be a case in which the memory cell 111 is programmed to the first state P1 or the second state P2. The programming for the high bit HB may be a case in which the memory cell 111 is programmed to the third state P3 or the fourth state P4. The equivalent resistor R(N) of the memory cell 111 corresponding to the n-th word line WL(N) in programming for the low bit LB may be less than the equivalent resistor R(N) of the memory cell 111 corresponding to the n-th word line WL(N) in programming for the high bit HB.

The first verification condition FVC that is used for verifying the programming for the low bit LB may be different from the second verification condition SVC that is used for verifying the programming for the high bit HB. For example, the amplitude of the bit line current IBL that is used for verifying the programming for the low bit LB in the first verification condition FVC may be less than the amplitude of the bit line current IBL that is used for verifying the programming for the high bit HB in the second verification condition SVC. In addition, the develop time that is used for verifying the programming for the low bit LB in the first verification condition FVC may be less than the develop time that is used for verifying the programming for the high bit HB in the second verification condition SVC. In addition, the word line voltage VWL that is used for verifying the programming for the low bit LB in the first verification condition FVC may be less than the word line voltage VWL that is used for verifying the programming for the high bit HB in the second verification condition SVC.

A method of programming a memory device according to at least one example embodiment may be capable of improving (or alternatively, optimizing) the threshold voltage distribution and decreasing power consumption by using different verification conditions in programming for a low bit LB and programming for a high bit HB.

Figure 7:
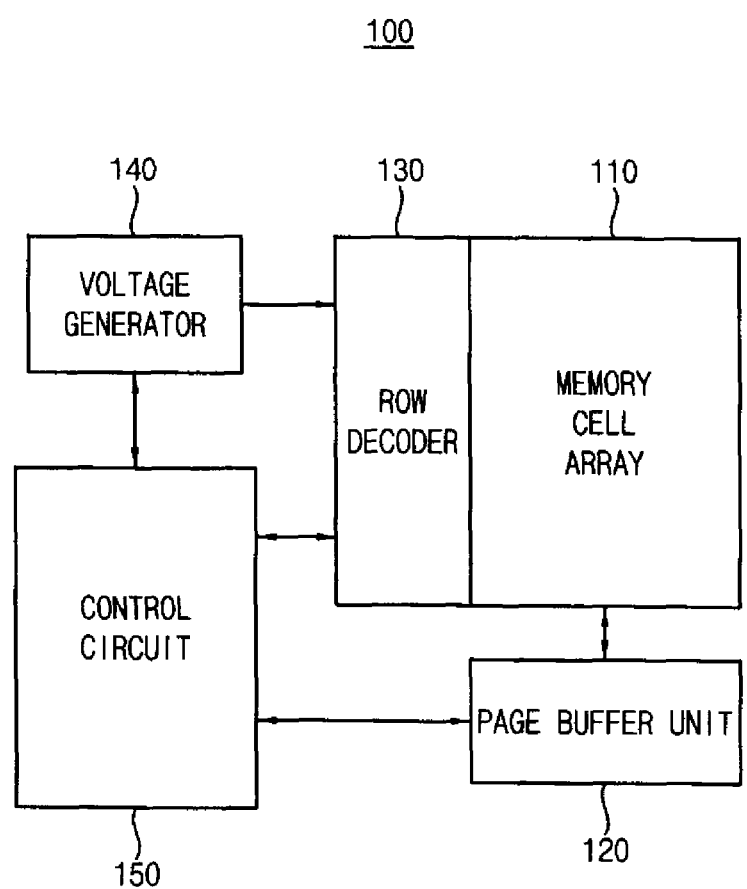
FIG. 7 is a block diagram illustrating a memory device of performing a program method according to at least one example embodiment.

FIG. 7 is a block diagram illustrating a memory device of performing a program method according to at least one example embodiment.

Referring to FIG. 7, a nonvolatile memory device 100 may be a flash memory device. The nonvolatile memory device 100 comprises a memory cell array 110, a page buffer unit 120, a row decoder 130, a voltage generator 140, and a control circuit 150.

Memory cell array 110 comprises multiple memory cells connected to multiple word lines and multiple bit lines, respectively. The memory cells may be NAND or NOR flash memory cells and may be arranged in a two or three dimensional array structure.

In at least one example embodiment, the memory cells may be single level cells (SLCs) or multi-level cells (MLCs). In example embodiments including MLCs, a program scheme in a write mode may be, for instance, a shadow program scheme, a reprogrammable scheme, or an on-chip buffered program scheme.

Page buffer unit 120 is connected to the bit lines and stores write data programmed in memory cell array 110 or read data sensed from memory cell array 110. In other words, page buffer unit 120 may be operated as a write driver or a sensing amplifier according to an operation mode of flash memory device 100. For example, page buffer unit 120 may be operated as the write driver in the write mode and as the sensing amplifier in the read mode.

Row decoder 130 is connected to the word lines and selects at least one of the word lines in response to a row address. Voltage generator 140 generates word line voltages such as a program voltage, a pass voltage, a verification voltage, an erase voltage and a read voltage according to a control of control circuit 150. Control circuit 150 controls page buffer unit 120, row decoder 130 and voltage generator 140 to perform program, erase, and read operations on memory cell array 110.

Figure 8:
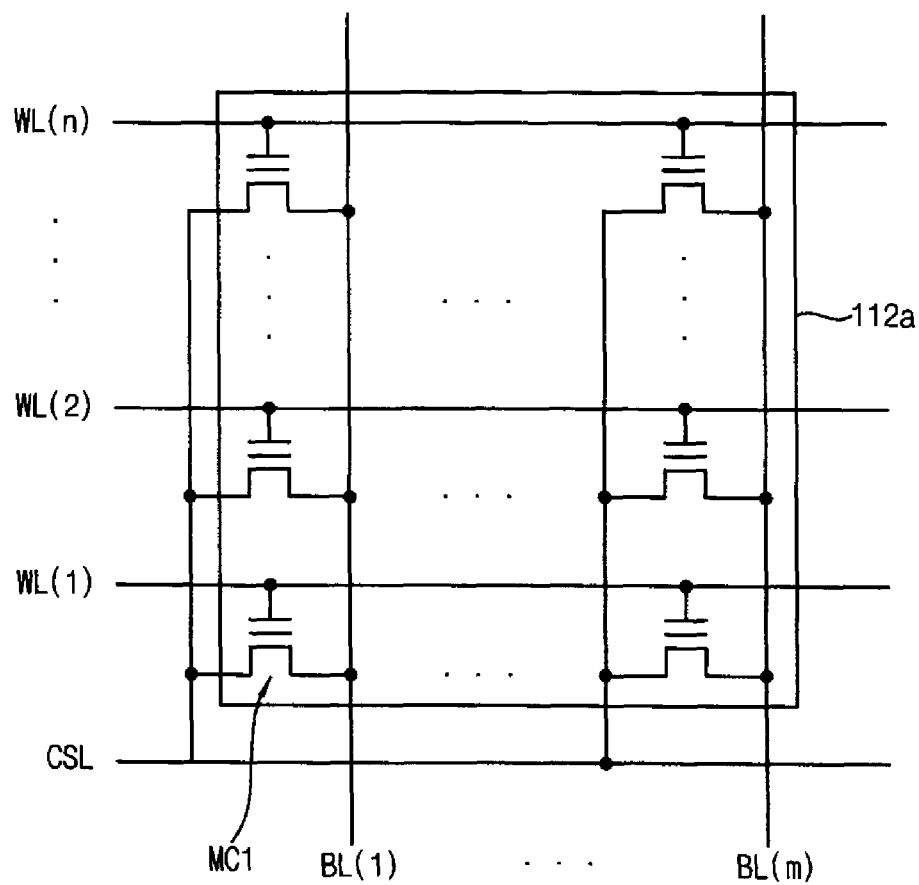
FIG. 8 is a diagram illustrating an example of a memory cell array included in the memory device of FIG. 7.
Figure 9:
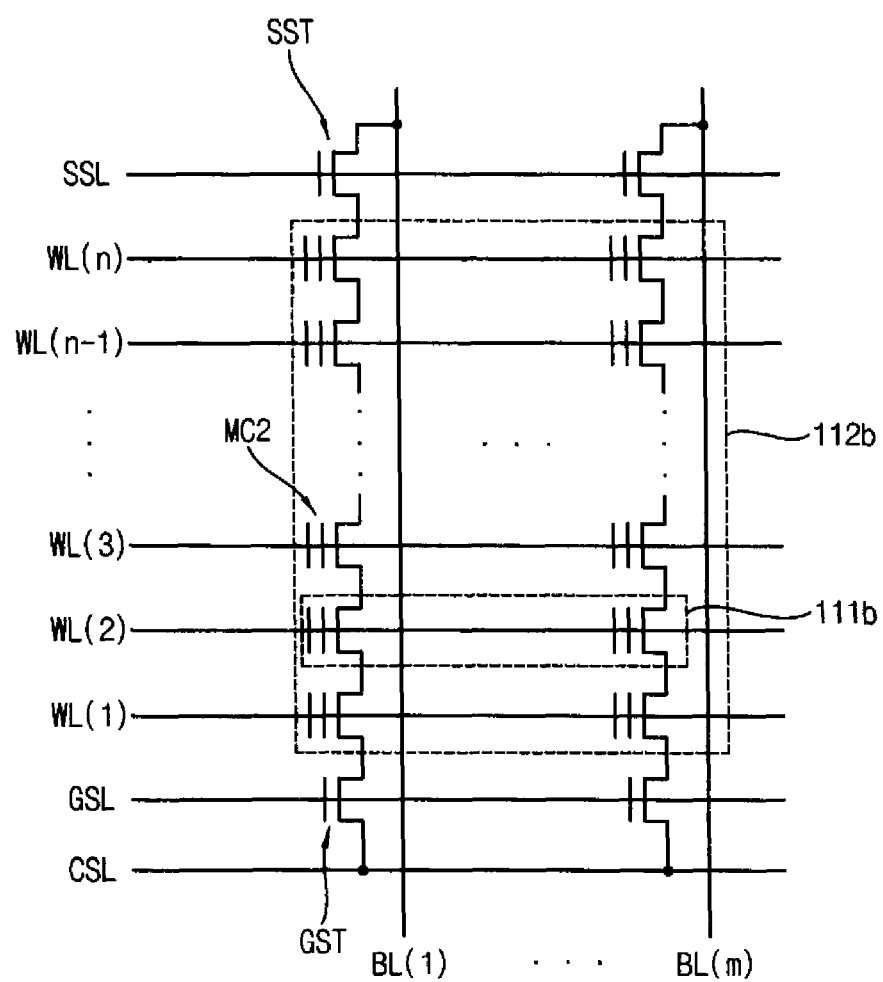
FIG. 9 is a diagram illustrating another example of a memory cell array included in the memory device of FIG. 7.
Figure 10:
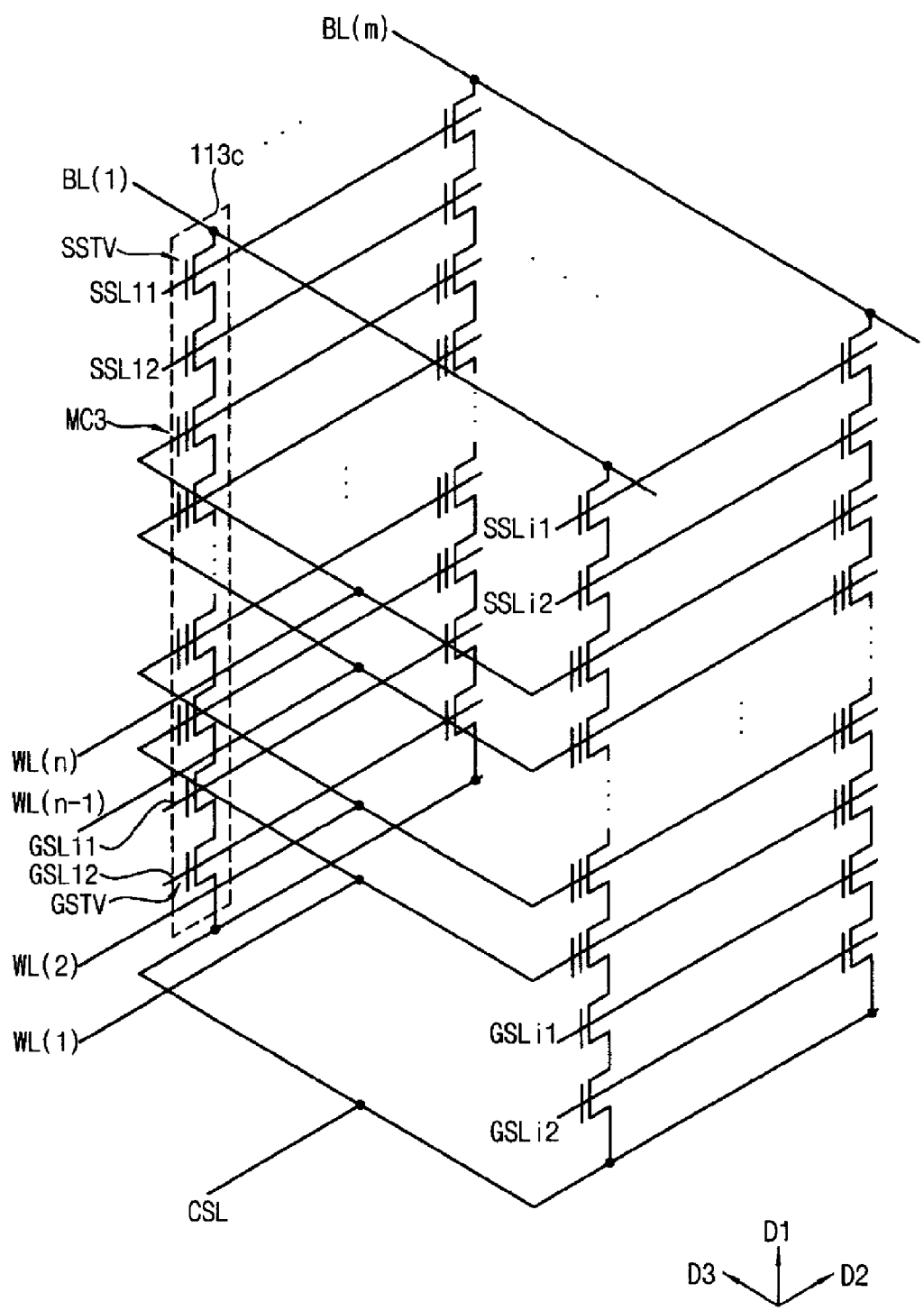
FIG. 10 is a diagram illustrating still another example of a memory cell array included in the memory device of FIG. 7.

FIG. 8 is a diagram illustrating an example of a memory cell array included in the memory device of FIG. 7, and FIG. 9 is a diagram illustrating another example of a memory cell array included in the memory device of FIG. 7. FIG. 10 is a diagram illustrating still another example of a memory cell array included in the memory device of FIG. 7.

Referring to FIG. 8, memory cell array 110a may include multiple memory cells MC1. Memory cells MC1 located in the same row may be disposed in parallel between one of bit lines BL(1), . . . , BL(m) and a common source line CSL and may be connected in common to one of word lines WL(1), WL(2), . . . , WL(n)). For example, memory cells located in the first row may be disposed in parallel between the first bit line WL(1) and common source line CSL. The gate electrodes of the memory cells disposed in the first row may be connected in common to first word line WL(1). Memory cells MC1 may be controlled according to a level of a voltage applied to word lines WL(1), . . . , WL(n). The NOR flash memory device comprising memory cell array 110a may perform the write and read operations in units of byte or words and may perform the erase operation in units of block.

Referring to FIG. 9, memory cell array 110b comprises string selection transistors SST, ground selection transistors GST and memory cells MC2. String selection transistors SST are connected to bit lines BL(1), . . . , BL(m), and ground selection transistors GST are connected to common source line CSL. Memory cells MC2 disposed in the same row are disposed in series between one of bit lines BL(1), . . . , BL(m) and common source line CSL, and memory cells MCs disposed in the same column are connected in common to one of word lines WL(1), WL(2), WL(3), . . . , WL(n−1), WL(n). That is memory cells MC2 are connected in series between string selection transistors SST and ground selection transistors GST, and the word lines of 16, 32, or 64 are disposed between string selection line SSL and ground selection line GSL.

String selection transistors SST are connected to string selection line SSL such that string selection transistors SST may be controlled according to a level of the voltage applied from string selection line SSL thereto. Memory cells MC2 may be controlled according to a level of a voltage applied to word lines WL(1), . . . , WL(n).

The NAND flash memory device comprising memory cell array 110b performs write and read operations in units of page 111b, and it performs erase operations in units of block 112b. Meanwhile, according to at least one example embodiment, each of the page buffers may be connected to even and odd bit lines one by one. In this case, the even bit lines form an even page, the odd bit lines form an odd page, and the even and odd pages may perform by turns and sequentially the write operation into memory cells MC2.

Referring to FIG. 10, memory cell array 110c comprises multiple strings 113c having a vertical structure. Strings 113c are formed in the second direction to form a string row. Multiple string rows are formed in the third row to form a string array. Each of strings 113c comprises ground selection transistors GSTV, memory cells MC3, and string selection transistors SSTV, which are disposed in series in the first direction between bit lines BL(1), . . . , BL(m) and common source line CSL.

Ground selection transistors GSTV are connected to ground selection lines GSL11, GSL12, . . . , GSLi1, GSLi2, respectively, and string selection transistors SSTV are connected to string selection lines SSL11, SSL12, . . . , SSLi1, SSLi2, respectively. Memory cells MC3 disposed the same layer are connected in common to one of word lines WL(1), WL(2), . . . , WL(n−1), WL(n). Ground selection lines GSL11, . . . , GSLi2 and string selection lines SSL11, . . . , SSLi2 extend in the second direction and are formed along the third direction. Word lines WL(1), . . . , WL(n) extend in the second direction and are formed along the first and third directions. Bit lines BL(1), . . . , BL(m) extend in the third direction and are formed along the second direction. Memory cells MC3 are controlled according to a level of a voltage applied to word lines WL(1), . . . , WL(n).

Because the vertical flash memory device comprising memory cell array 110c comprises NAND flash memory cells, like the NAND flash memory device, the vertical flash memory device performs the write and read operations in units of pages and the erase operation in units of block.

In at least one example embodiment, two string selection transistors in one string 113c are connected to one string selection line and two ground selection transistors in one string are connected to one ground selection line. Further, according to at least one example embodiment, one string comprises one string selection transistor and one ground selection transistor.

Figures 11, 12:
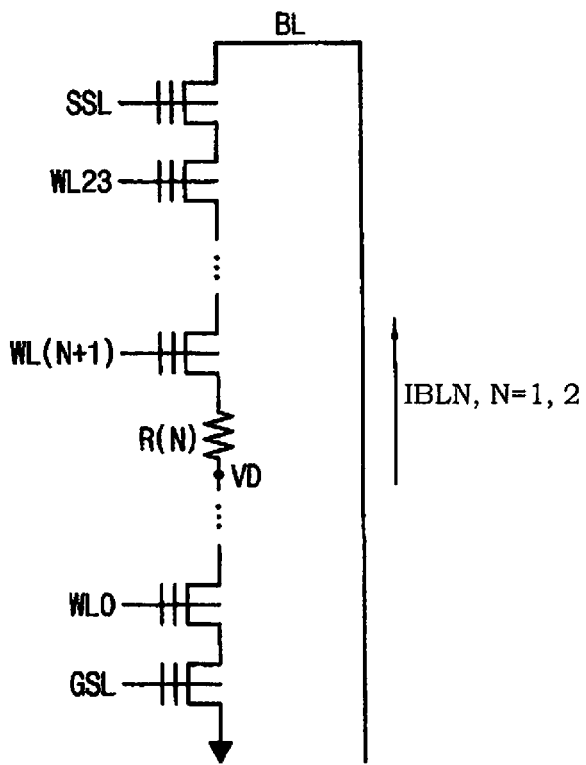
FIGS. 11 and 12 are diagrams for describing a bit line current according to programming for a low bit and programming for a high bit.

FIGS. 11 and 12 are diagrams for describing a bit line current according to programming for a low bit and programming for a high bit.

Referring to FIGS. 11 and 12, the first verification condition FVC may be determined based on a first bit line current IBL1 that is transferred through the bit line. The second verification condition SVC may be determined based on a second bit line current IBL2 that is transferred through the bit line. The verification condition that is used for verifying the programming for the low bit LB may be a first verification condition FVC. The verification condition that is used for verifying the programming for the high bit HB may be a second verification condition SVC. For example, the verification condition may be changed according to the precharge level BLPL of the bit line. The precharge level BLPL of the bit line may be the bit line current IBL or the bit line voltage that is provided to the bit line to verify the programming for the data.

The equivalent resistor R(N) of the memory cell 111 corresponding to the n-th word line WL(N) in programming for the low bit LB may be less than the equivalent resistor R(N) of the memory cell 111 corresponding to the n-th word line WL(N) in programming for the high bit HB. For example, if the bit line current IBL having the same precharge level BLPL of the bit line in the programming for the low bit LB and the programming for the high bit HB is transferred through the bit line, because the equivalent resistor R(N) of the memory cell 111 corresponding to the n-th word line WL(N) in programming for the low bit LB is less than the equivalent resistor R(N) of the memory cell 111 corresponding to the n-th word line WL(N) in programming for the high bit HB, a drain voltage VD in the programming for the low bit LB may be greater than the drain voltage VD in the programming for the high bit HB. In this case, the precharge level BLPL of the bit line may be decreased in the programming for the low bit LB. If the precharge level BLPL of the bit line is decreased in the programming for the low bit LB, the current consumption in the programming for the data may be decreased.

In an example embodiment, the amplitude of the first bit line current IBL1 may be less than the amplitude of the second bit line current IBL2.

Figures 13, 14:
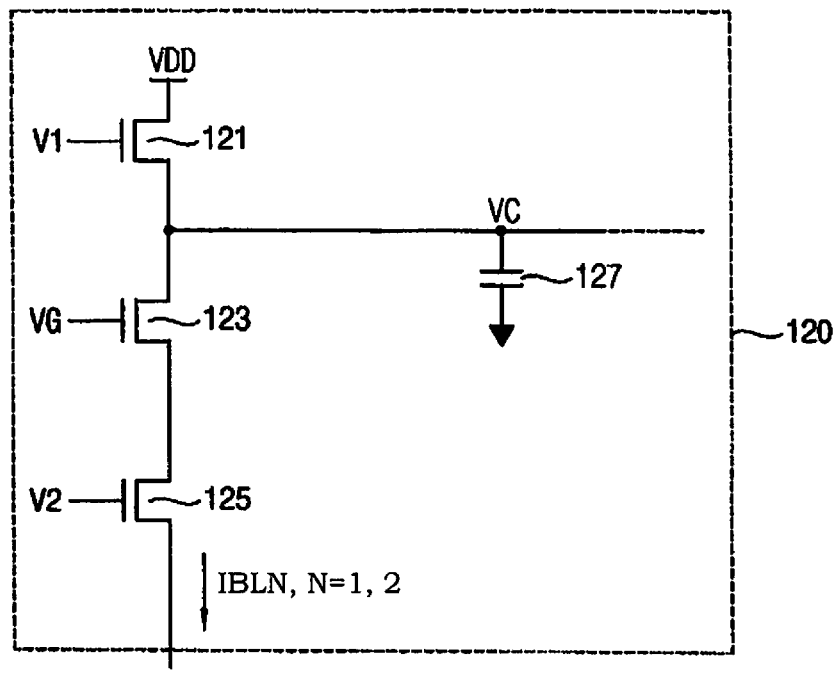
FIGS. 13 and 14 are diagrams illustrating a bit line current and a gate voltage according to programming for a low bit and programming for a high bit.

FIGS. 13 and 14 are diagrams illustrating a bit line current and a gate voltage according to programming for a low bit and programming for a high bit.

Referring to FIGS. 13 and 14, a page buffer 120 may include a first transistor 121, a second transistor 125, a control transistor 123 and a capacitor 127. The amplitude of the first bit line current IBL1 and the amplitude of the second bit line current IBL2 may be determined based on a gate voltage VG of a control transistor 123 included in a page buffer 120 that is connected to the bit line BL. To transfer the current through the bit line BL, the first transistor 121 and the second transistor 125 may be turned-on. The bit line current IBL may be determined according to the gate voltage VG applied to the gate of the control transistor 123.

In an example embodiment, the amplitude of the first bit line current IBL1, the amplitude of the second bit line current IBL2 may be determined based on a gate voltage VG of a control transistor 123 included in a page buffer 120 that is connected to the bit line BL.

In an example embodiment, the gate voltage VG of the control transistor 123 to provide the first bit line current IBL1 may be less than the gate voltage VG of the control transistor 123 to provide the second bit line current IBL2. For example, if the gate voltage VG is increased, the bit line current IBL may be increased. The first bit line current IBL1 may be less than the second bit line current IBL2. In this case, the gate voltage VG required to provide the first bit line current IBL1 may be less than the gate voltage VG required to provide the second bit line current IBL2. Therefore, the first verification condition FVC determined based on the first bit line current IBL1 may be different from the second verification condition SVC determined based on the second bit line current IBL2.

A method of programming a memory device according to at least one example embodiment may be capable of improving (or alternatively, optimizing) the threshold voltage distribution and decreasing power consumption by using the lower precharge level BLPL of the bit line BL in programming for the low bit LB than the precharge level BLPL of the bit line BL in programming for the high bit HB.

Figure 16:
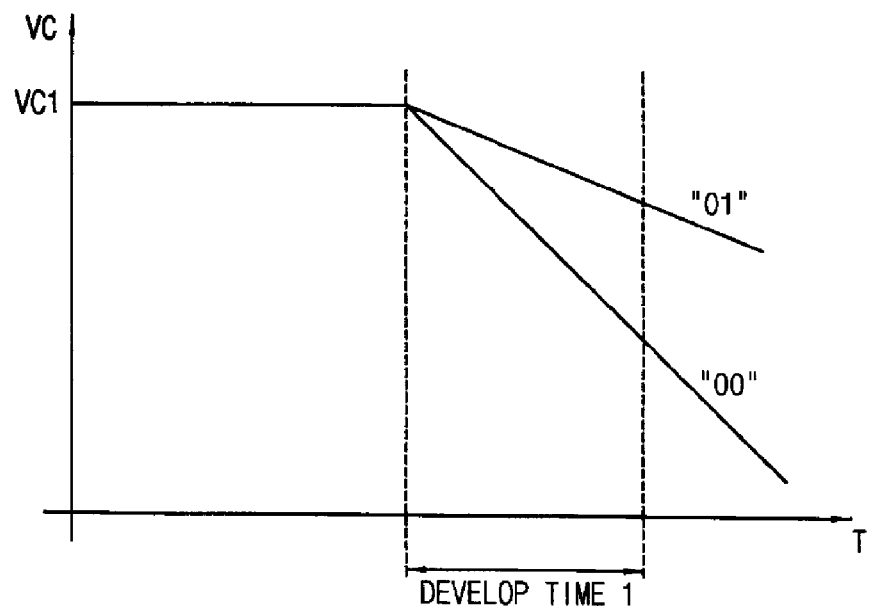
FIG. 16 is a diagram illustrating an example of a develop time according to programming for a low bit.
Figure 17:
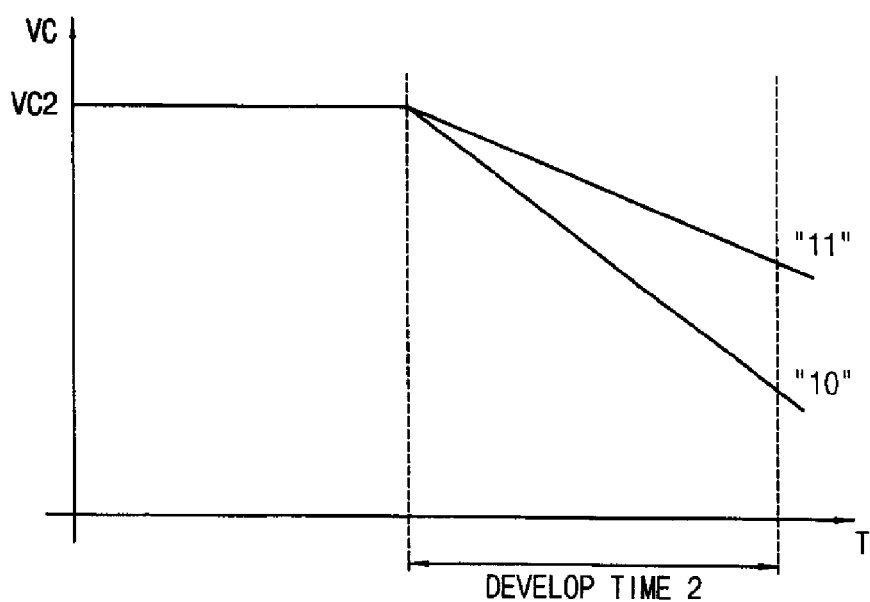
FIG. 17 is a diagram illustrating an example of a develop time according to programming for a high bit.

FIG. 15 is a diagram for describing a develop time according to programming for a low bit and programming for a high bit and FIG. 16 is a diagram illustrating an example of a develop time according to programming for a low bit. FIG. 17 is a diagram illustrating an example of a develop time according to programming for a high bit.

Referring to FIGS. 13 and 15 to 17, while the bit line current IBL is transferred through the bit line BL, the capacitor voltage VC may be a constant. After that, if the first transistor 121 is turned-off, the bit line current IBL may not be transferred through the bit line BL any more. If the first transistor 121 is turned-off, the capacitor voltage VC may be decreased gradually. The verification condition may be changed according to the develop time. The develop time may be a transition time of the bit line current IBL or the bit line voltage after applying of the bit line current IBL or the bit line voltage to the bit line BL is stopped. After the develop time, the programmed data may be verified.

The equivalent resistor R(N) of the memory cell 111 corresponding to the n-th word line WL(N) in programming for the low bit LB may be less than the equivalent resistor R(N) of the memory cell 111 corresponding to the n-th word line WL(N) in programming for the high bit HB. For example, if the bit line current IBL having the same precharge level BLPL of the bit line BL in the programming for the low bit LB and the programming for the high bit HB is transferred through the bit line BL, because the equivalent resistor R(N) of the memory cell 111 corresponding to the n-th word line WL(N) in programming for the low bit LB is less than the equivalent resistor R(N) of the memory cell 111 corresponding to the n-th word line WL(N) in programming for the high bit HB, the develop time in the programming for the low bit LB may be less than the develop time in the programming for the high bit HB. In this case, the develop time may be decreased in the programming for the low bit LB. If the develop time is decreased in the programming for the low bit LB, the current consumption in the programming for the data may be decreased.

In at least one example embodiment, the first verification condition FVC may be determined based on a first develop time. The first develop time may be a time required for verifying the programming for the low bit LB. The second verification condition SVC may be determined based on a second develop time. The second develop time may be a time required for verifying the programming for the high bit HB. The first develop time may be less than the second develop time.

In at least one example embodiment, the first develop time may be less than the second develop time.

Figures 18, 19:
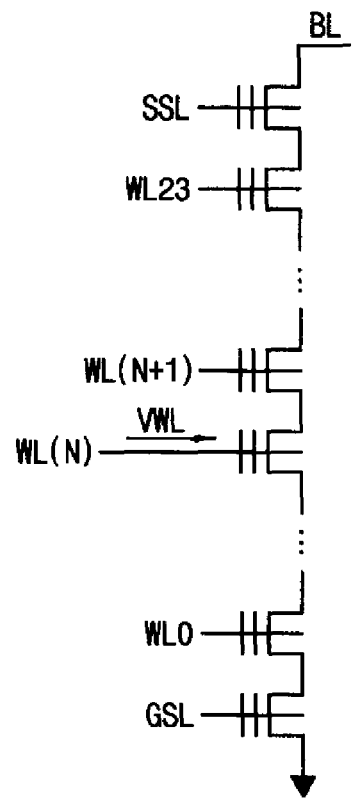
FIGS. 18 and 19 are diagrams for describing a word line voltage according to programming for a low bit and programming for a high bit.

FIGS. 18 and 19 are diagrams for describing a word line voltage according to programming for a low bit and programming for a high bit.

Referring to FIGS. 18 and 19, the first verification condition FVC may be determined based on a first word line voltage that is provided to the first word line WL(N). The second verification condition SVC may be determined based on a second word line voltage that is provided to the second word line WL(N+1).

For example, if the bit line current IBL having the same precharge level BLPL of the bit line BL in the programming for the low bit LB and the programming for the high bit HB is transferred through the bit line BL, because the equivalent resistor R(N) of the memory cell 111 corresponding to the n-th word line WL(N) in programming for the low bit LB is less than the equivalent resistor R(N) of the memory cell 111 corresponding to the n-th word line WL(N) in programming for the high bit HB, the word line voltage VWL in the programming for the low bit LB may be less than the word line voltage VWL in the programming for the high bit HB. In this case, the word line voltage VWL may be decreased in the programming for the low bit LB. If the word line voltage VWL is decreased in the programming for the low bit LB, the current consumption in the programming for the data may be decreased. The threshold voltage distribution may be improved (or alternatively, optimized).

In at least one example embodiment, the amplitude of the first word line voltage may be different from the amplitude of the second word line voltage. The amplitude of the first word line voltage may be less than the amplitude of the second word line voltage.

Figure 20:
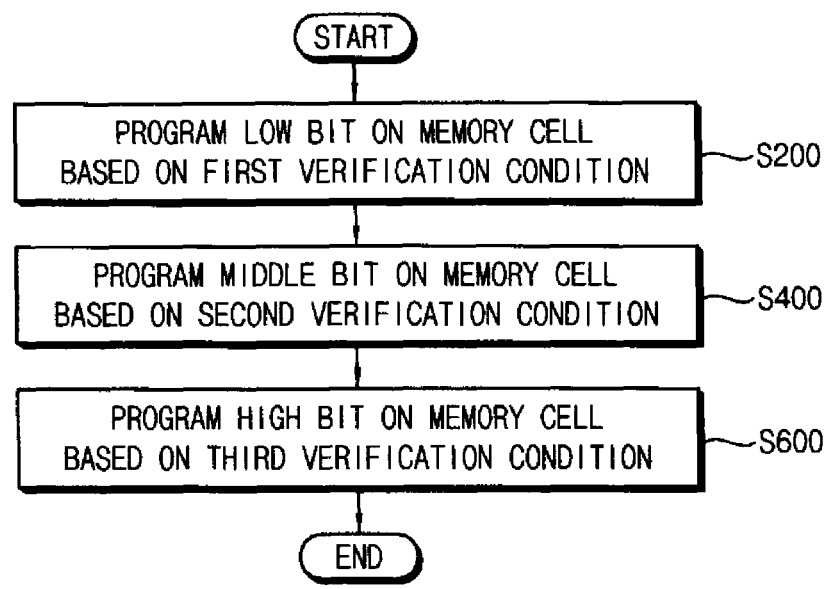
FIG. 20 is a flow chart illustrating a method of programming a memory device according to at least one example embodiment.

FIG. 20 is a flow chart illustrating a method of programming a memory device according to at least one example embodiment. The operations of FIG. 20 may be carried out by a memory controller (e.g., the memory controller of FIGS. 26-29 described below).

Referring to FIGS. 2 to 4 and 20, in a method of programming a memory device according to at least one example embodiment, a low bit LB is programmed on a memory cell 111 included in one word line and one bit line BL based on a first verification condition FVC (S200). The first verification condition FVC is applied to programming for the low bit (or least significant bit) LB of a high bit (or a most significant bit) HB, a middle bit (or a central significant bit) MB and the low bit LB that are programmed on the memory cell 111. The middle bit MB is programmed on the memory cell 111 based on a second verification condition SVC (S400). The second verification condition SVC is applied to programming for the middle bit MB. The high bit HB is programmed on the memory cell 111 based on a third verification condition TVC (S600). The third verification condition TVC is applied to programming for the high bit HB.

The memory cell 111 may be a multi level cell. For example, data to be programmed on the memory cell 111 may be '000', '001' . . . '111'. For example, if the data to be programmed on the memory cell 111 is '100', the low bit LB may be '0', the middle bit MB may be '0' and the high bit HB may be '1'.

Therefore, the equivalent resistor R(N) of the memory cell 111 corresponding to the n-th word line WL(N) in programming for the low bit LB may be less than the equivalent resistor R(N) of the memory cell 111 corresponding to the n-th word line WL(N) in programming for the middle bit MB. The equivalent resistor R(N) of the memory cell 111 corresponding to the n-th word line WL(N) in programming for the middle bit MB may be less than the equivalent resistor R(N) of the memory cell 111 corresponding to the n-th word line WL(N) in programming for the high bit HB. In this case, the verification condition that is used for verifying the programming for the low bit LB may be a first verification condition FVC. The verification condition that is used for verifying the programming for the middle bit MB may be a second verification condition SVC. The verification condition that is used for verifying the programming for the high bit HB may be a third verification condition TVC. For example, the first verification condition FVC may be different from the second verification condition SVC and the third verification condition TVC. Also, the first verification condition FVC may be equal to the second verification condition SVC and the third verification condition TVC. For example, after the high bit HB is programmed on the memory cell 111 based on the third verification condition TVC, the low bit LB may be programmed again based on a fourth verification condition and the middle bit MB may be programmed again based on a fifth verification condition and the high bit HB may be programmed again based on a sixth verification condition. For example, the fourth verification condition may be different from the fifth verification condition and the sixth verification condition. Also, the fourth verification condition may be equal to the fifth verification condition and the sixth verification condition.

The verification condition may be changed according to a precharge level BLPL of the bit line BL, a develop time and a word line voltage VWL. The precharge level BLPL of the bit line BL may be a bit line current IBL or a bit line voltage that is provided to the bit line BL to verify the programming for the data. The develop time may be a transition time of the bit line current IBL or the bit line voltage after provision of the bit line current IBL or the bit line voltage to the bit line BL is stopped. The word line voltage VWL may be a voltage applied to the n-th word line WL(N).

The first verification condition FVC that is used for verifying the programming for the low bit LB may be different from the second verification condition SVC that is used for verifying the programming for the middle bit MB and the third verification condition TVC that is used for verifying the programming for the high bit HB. A method of programming a memory device according to at least one example embodiment may be capable of improving (or alternatively, optimizing) the threshold voltage distribution by using different verification conditions in programming for a low bit LB, programming for a middle bit MB and programming for a high bit HB.

Figure 21:
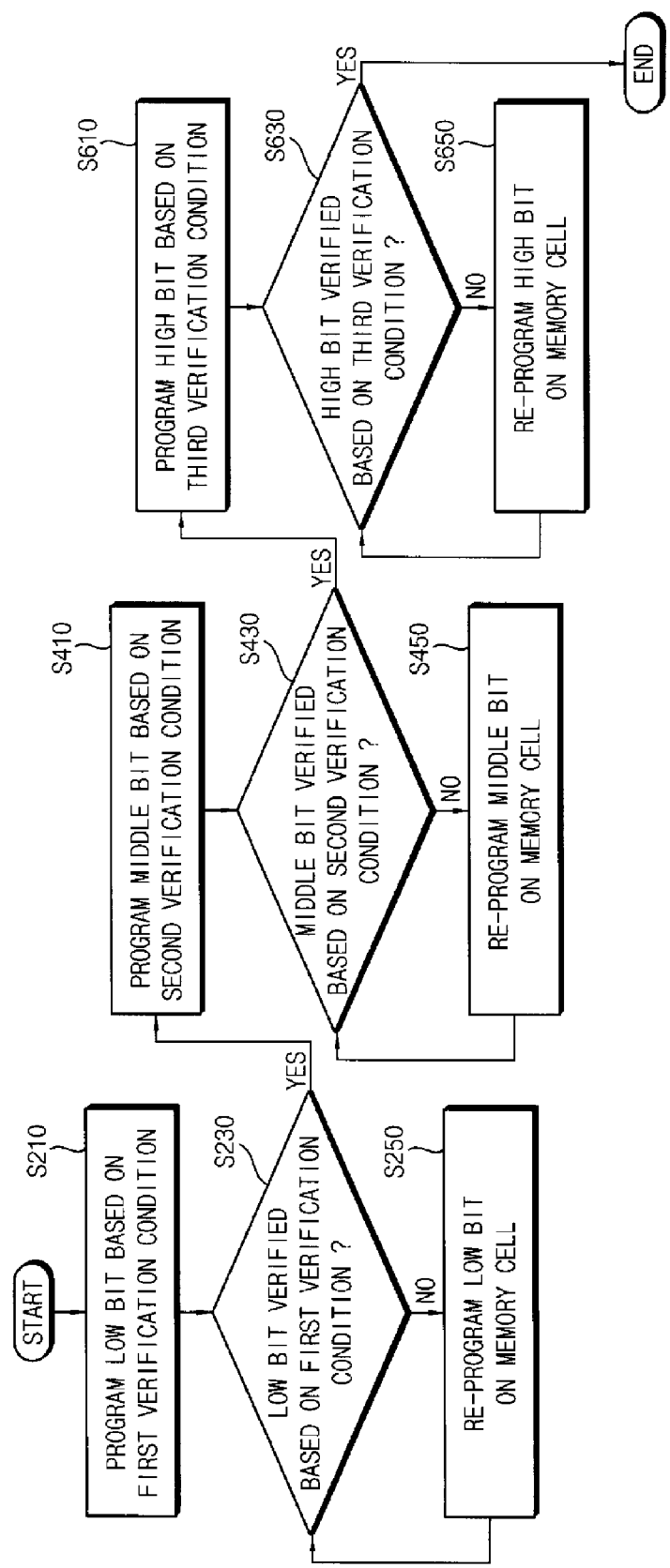
FIG. 21 is a flow chart illustrating a method of programming a memory device according to at least one example embodiment.

FIG. 21 is a flow chart illustrating a method of programming a memory device according to at least one example embodiment. The operations of FIG. 21 may be carried out by a memory controller (e.g., the memory controller of FIGS. 26-29 described below).

Referring to FIG. 21, in programming the low bit LB on the memory cell 111 (S200), the low bit LB may be programmed based on the first verification condition FVC (S210). The low bit LB that is programmed on the memory cell 111 may be verified based on the first verification condition FVC (S230). The low bit LB may be re-programmed if the verification for the low bit LB fails (S250) and the verifying operation may be performed again based on the first verification condition FVC (S230). If the verification for the low bit LB succeeds, the middle bit MB may be programmed on the memory cell 111 based on the second verification condition SVC.

In programming the middle bit MB on the memory cell 111 (S400), the middle bit MB may be programmed based on the second verification condition SVC (S410). The middle bit MB that is programmed on the memory cell 111 may be verified based on the second verification condition SVC (S430). The middle bit MB may be re-programmed if the verification for the middle bit MB fails (S450) and the verifying operation may be performed again based on the second verification condition SVC (S430). If the verification for the middle bit MB succeeds, the high bit HB may be programmed on the memory cell 111 based on the third verification condition TVC.

In programming the high bit HB on the memory cell 111 (S600), the high bit HB may be programmed based on the third verification condition TVC (S610). The high bit HB that is programmed on the memory cell 111 may be verified based on the third verification condition TVC (S630). The high bit HB may be re-programmed if the verification for the high bit HB fails (S650) and the verifying operation may be performed again based on the third verification condition TVC (S630). If the verification for the high bit HB succeeds, the program operation for the memory cell 111 may be finished.

In FIGS. 20 and 21, the programmed data bit is 3 bits. However, the method of programming the memory device may be used if the programmed data bit is a plurality of bits.

FIG. 22 is a diagram for describing a bit line current according to programming for a low bit, programming for a middle bit and programming for a high bit.

Referring to FIGS. 11 and 22, the first verification condition FVC may be determined based on a first bit line current IBL1 that is transferred through the bit line BL. The second verification condition SVC may be determined based on a second bit line current IBL2 that is transferred through the bit line BL. The third verification condition TVC may be determined based on a third bit line current IBL3 that is transferred through the bit line BL. The verification condition that is used for verifying the programming for the low bit LB may be a first verification condition FVC. The verification condition that is used for verifying the programming for the middle bit MB may be a second verification condition SVC. The verification condition that is used for verifying the programming for the high bit HB may be a third verification condition TVC. For example, the verification condition may be the precharge level BLPL of the bit line BL. The precharge level BLPL of the bit line BL may be the bit line current IBL or the bit line voltage that is provided to the bit line BL to verify the programming for the data.

The equivalent resistor R(N) of the memory cell 111 corresponding to the n-th word line WL(N) in programming for the low bit LB may be less than the equivalent resistor R(N) of the memory cell 111 corresponding to the n-th word line WL(N) in programming for the middle bit MB. In addition, the equivalent resistor R(N) of the memory cell 111 corresponding to the n-th word line WL(N) in programming for the middle bit MB may be less than the equivalent resistor R(N) of the memory cell 111 corresponding to the n-th word line WL(N) in programming for the high bit HB.

For example, if the bit line current IBL having the same precharge level BLPL of the bit line BL in the programming for the low bit LB, the programming for the middle bit MB and the programming for the high bit HB is transferred through the bit line BL, because the equivalent resistor R(N) of the memory cell 111 corresponding to the n-th word line WL(N) in programming for the low bit LB is less than the equivalent resistor R(N) of the memory cell 111 corresponding to the n-th word line WL(N) in programming for the middle bit MB, a drain voltage VD in the programming for the low bit LB may be greater than the drain voltage VD in the programming for the middle bit MB. Because the equivalent resistor R(N) of the memory cell 111 corresponding to the n-th word line WL(N) in programming for the middle bit MB is less than the equivalent resistor R(N) of the memory cell 111 corresponding to the n-th word line WL(N) in programming for the high bit HB, a drain voltage VD in the programming for the middle bit MB may be greater than the drain voltage VD in the programming for the high bit HB.

In this case, the precharge level BLPL of the bit line BL may be decreased in the programming for the low bit LB and the programming for the middle bit MB. If the precharge level BLPL of the bit line BL is decreased in the programming for the low bit LB and the programming for the middle bit MB, the current consumption in the programming for the data may be decreased.

FIG. 23 is a diagram illustrating a bit line current and a gate voltage VG according to programming for a low bit, programming for a middle bit and programming for a high bit HB.

Referring to FIGS. 13 and 23, a page buffer 120 may include a first transistor 121, a second transistor 125, a control transistor 123 and a capacitor 127. The amplitude of the first bit line current IBL1, the amplitude of the second bit line current IBL2 and the amplitude of the third bit line current IBL3 may be determined based on a gate voltage VG of a control transistor 123 included in a page buffer 120 that is connected to the bit line BL. To transfer the current through the bit line BL, the first transistor 121 and the second transistor 125 may be turned-on. The bit line current IBL may be determined according to the gate voltage VG applied to the gate of the control transistor 123.

In an example embodiment, the first verification condition FVC may be determined based on a first bit line current IBL1 that is transferred through the bit line BL. The second verification condition SVC may be determined based on a second bit line current IBL2 that is transferred through the bit line BL. The third verification condition TVC may be determined based on a third bit line current IBL3 that is transferred through the bit line BL. The amplitude of the first bit line current IBL1 may be less than the amplitude of the second bit line current IBL2 and the amplitude of the third bit line current IBL3.

In an example embodiment, the amplitude of the first bit line current IBL1, the amplitude of the second bit line current IBL2 and the amplitude of the third bit line current IBL3 may be determined based on a gate voltage VG of a control transistor 123 included in a page buffer 120 that is connected to the bit line BL.

In an example embodiment, the gate voltage VG of the control transistor 123 to provide the first bit line current IBL1 may be less than the gate voltage VG of the control transistor 123 to provide the second bit line current IBL2 and the gate voltage VG of the control transistor 123 to provide the third bit line current IBL3.

The method of programming a memory device according to at least one example embodiment may be capable of improving (or alternatively, optimizing) the threshold voltage distribution by using different verification conditions in programming for a low bit LB, programming for a middle bit MB and programming for a high bit HB.

FIG. 24 is a diagram for describing a develop time according to programming for a low bit, programming for a middle bit and programming for a high bit.

Referring to FIGS. 13 and 24, while the bit line current IBL is transferred through the bit line BL, the capacitor voltage VC may be a constant. After that, if the first transistor 121 is turned-off, the bit line current IBL may not be transferred through the bit line BL any more. If the first transistor 121 is turned-off, the capacitor voltage VC may be decreased gradually. The verification condition may be changed according to the develop time. The develop time may be a transition time of the bit line current IBL or the bit line voltage after provision of the bit line current IBL or the bit line voltage to the bit line BL is stopped. After the develop time, the programmed data may be verified.

In at least one example embodiment, the first verification condition FVC may be determined based on a first develop time (or first verification time). The first develop time (or first verification time) may be a time required for verifying the programming for the low bit LB. The second verification condition SVC may be determined based on a second develop time (or second verification time). The second develop time (or second verification time) may be a time required for verifying the programming for the middle bit MB. The third verification condition TVC may be determined based on a third develop time (or third verification time). The third develop time (or third verification time) may be a time required for verifying the programming for the high bit HB. The first develop time may be less than the second develop time and the third develop time.

FIG. 25 is a diagram for describing a word line voltage according to programming for a low bit, programming for a middle bit and programming for a high bit.

Referring to FIGS. 18 and 25, the first verification condition FVC may be determined based on a first word line voltage VWL1 that is provided to the word line. The second verification condition SVC may be determined based on a second word line voltage VWL2 that is provided to the word line. The third verification condition TVC may be determined based on a third word line voltage VWL3 that is provided to the word line. The amplitude of the first word line voltage VWL1 may be less than the amplitude of the second word line voltage VWL2 and the amplitude of the third word line voltage VWL3.

Figure 26:
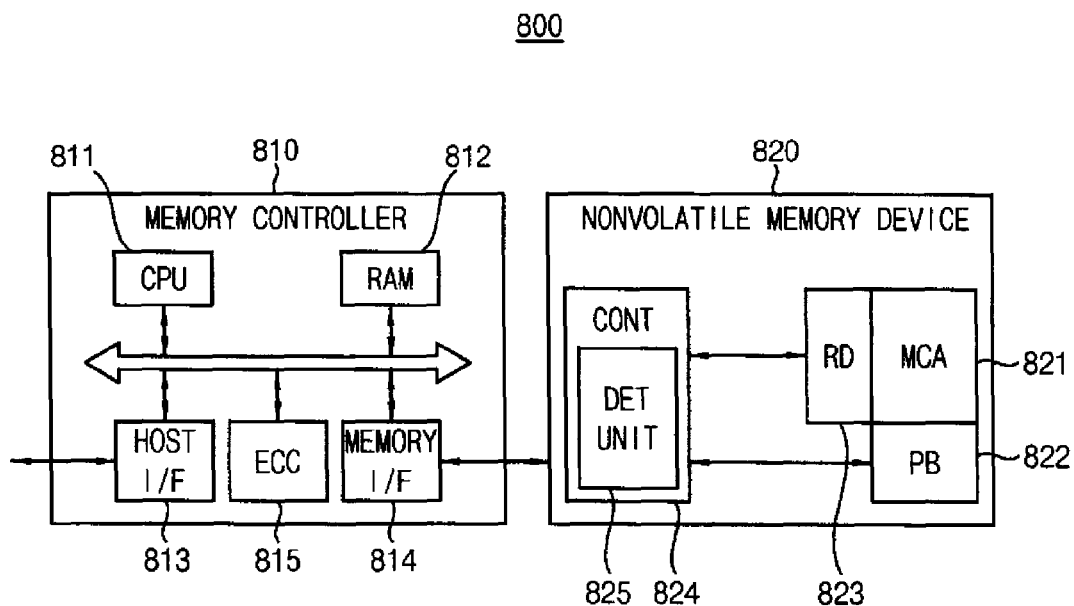
FIG. 26 is a block diagram illustrating a memory system according to at least one example embodiment.

FIG. 26 is a block diagram illustrating a memory system according to at least one example embodiment.

Referring to FIG. 26, memory system 800 comprises a memory controller 810 and a nonvolatile memory device 820.

Nonvolatile memory device 820 comprises a memory cell array 821, a page buffer unit 822, a row decoder 823, and a control circuit 824. Memory cell array 821 comprises multiple memory cells, page buffer unit 822 may be operated as a write driver or a sensing amplifier according to an operation mode, and row decoder 823 may select a word line in response to a row address. Control circuit 824 controls page buffer unit 822 and row decoder 823, and may comprise a determination unit 825 which performs the second verify operation for whether a program/erase error symptom exists in the target memory cells of the memory cells.

Nonvolatile memory device 820 may further perform the second verify operation for verifying whether the program/erase error symptom exists in the target memory cells which is determined as the program/erase pass state based on the result of the first verify operation, and may perform the repair operation for the target memory cells which are determined as the program/erase error symptom or the existence of the program/erase error symptom, so that nonvolatile memory device 820 may effectively prevent from being generated an error which is uncorrectable due to the generation of a progressive badness in the target memory cells determined as the state of a program/erase pass and the performance of nonvolatile memory device 820 may be improved.

Memory controller 810 controls nonvolatile memory device 820. Memory controller 810 controls a data exchange between an external host (not shown) and nonvolatile memory device 820. Memory controller 810 may include a CPU (Central Processing Unit) 811, a buffer memory 812, a host interface 813, and a memory interface 814. CPU 811 may perform an operation for the data exchange. Buffer memory 812 comprises a dynamic random access memory (DRAM), static random access memory (SRAM), phase-change RAM (PRAM), ferroelectric RAM (FRAM), resistive RAM (RRAM), or magnetoresistive RAM (MRAM).

According to at least one example embodiment of inventive concepts, buffer memory 812 may be placed at an inside or outside of controller 810.

Host interface 813 is connected to host and memory interface 814 is connected to nonvolatile memory device 820. CPU 811 communicates with the host through host interface 813. For example, host interface 813 may be configured to communicate with the host through at least one among various interface protocols such as Universal Serial Bus (USB), Multi-Media Card (MMC), Peripheral Component Interconnect-Express (PCI-E), Serial-attached SCSI (SAS), Serial Advanced Technology Attachment (SATA), Parallel Advanced Technology Attachment (PATA), Small Computer System Interface (SCSI), Enhanced Small Disk Interface (ESDI), or Integrated Drive Electronics (IDE). Further, CPU 811 may communicate with memory device 820 through memory interface 814. According to at least one example embodiment of inventive concepts, memory controller 810 may further comprise an error correction block 815 for correcting an error. According to at least one example embodiment of inventive concepts, memory controller 810 comprises a built-in memory device 820 or memory controller 810 and nonvolatile memory device 820 may be implemented as mutually separated chips.

Memory system 800 may be implemented in such a form as a memory card or a solid state drive. nonvolatile memory device 820, memory controller 810 and/or memory system 800 may be implemented in various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flat-pack (TQFP), System In Package (SIP), Multi Chip Package (MCP), Wafer-level Fabricated Package (WFP), or Wafer-Level Processed Stack Package (WSP).

Figure 27:
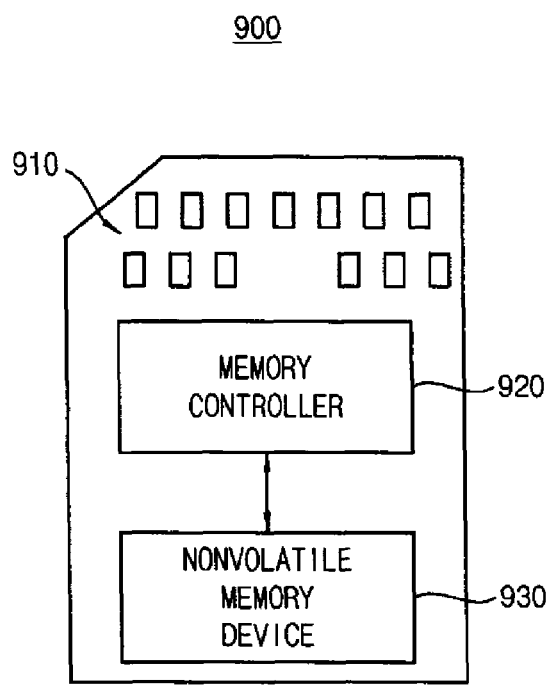
FIG. 27 is a diagram illustrating an application example of a memory system to a memory card according to at least one example embodiment.

FIG. 27 is a diagram illustrating an application example of a memory system to a memory card according to at least one example embodiment.

Referring to FIG. 27, a memory card 900 comprises multiple connecting pins 910, a memory controller 920 and a nonvolatile memory device 930.

Connecting pins 910 are connected to a host (not shown) such that signals are transceived between the host and memory card 900. Connecting pin 910 comprises a clock pin, a command pin, data pin and/or a reset pin.

Memory controller 920 receives data from the host and stores the received data in nonvolatile memory device 930. Nonvolatile memory device 930 further performs the second verify operation for verifying whether the program/erase error symptom exists in the target memory cells which is determined as the program/erase pass state based on the result of the first verify operation, and may perform the repair operation for the target memory cells which are determined as the program/erase error symptom or the existence of the program/erase error symptom, so that nonvolatile memory device 930 may effectively prevent from being generated an error which is uncorrectable due to the generation of a progressive badness in the target memory cells determined as the program/erase pass state and the performance of nonvolatile memory device 930 may be improved.

Memory card 900 may be, for instance, a memory card such as a an Multi-Media Card (MMC), an embedded Multi-Media Card (eMMC), a hybrid eMMC, a Secure Digital (SD) card, a micro-SD card, a memory stick, an ID card, a Personal Computer Memory Card International Association (PCMCIA) card, a chip card, an USB card, a smart card, or a Compact Flash (CF) Card.

According to at least one example embodiment of inventive concepts, memory card 900 may be installed into a host such as a computer, a laptop computer, a cellular phone, a smart phone, an MP3 player, a Personal Digital Assistants (PDA), a Portable Multimedia Player (PMP), a digital TV, a digital camera, or a portable game console.

Figure 28:
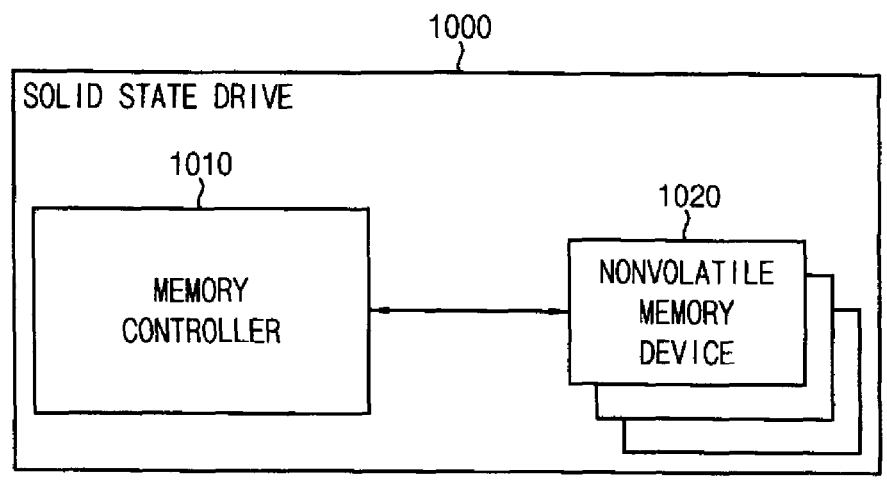
FIG. 28 is a diagram illustrating an application example of a memory system to a solid state drive according to at least one example embodiment.

FIG. 28 is a diagram illustrating an application example of a memory system to a solid state drive according to at least one example embodiment.

Referring to FIG. 28, SSD 1000 comprises a memory controller 1010 and multiple nonvolatile memory devices 1020.

Memory controller 1010 receives data from the host (not shown) and stores the received data in nonvolatile memory device 1020

According to at least one example embodiment of inventive concepts, SSD 1000 may be installed into a host such as a computer, a laptop computer, a cellular phone, a smart phone, an MP3 player, a Personal Digital Assistants (PDA), a Portable Multimedia Player (PMP), a digital TV, a digital camera, or a portable game console.

Figure 29:
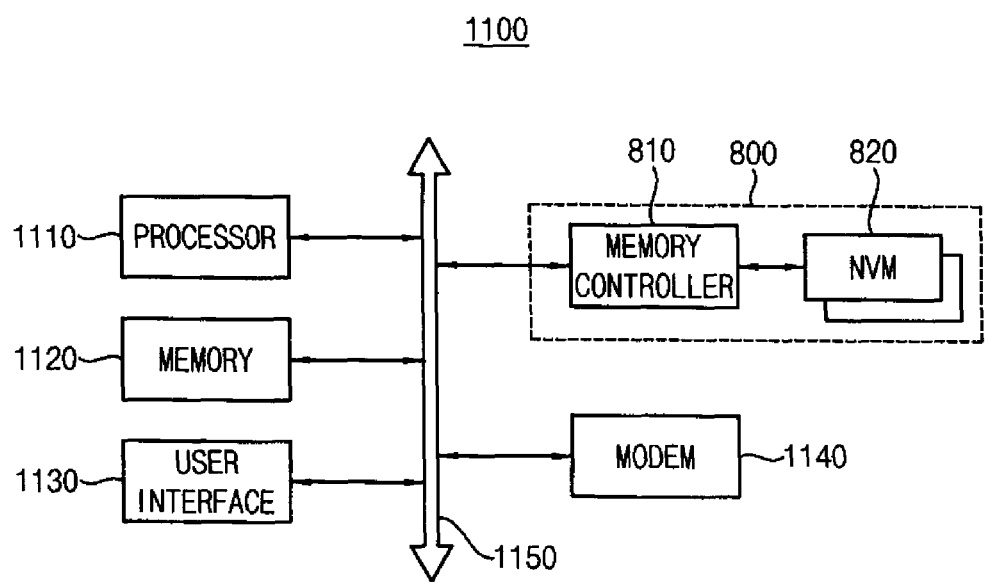
FIG. 29 is a block diagram illustrating a computing system according to at least one example embodiment.

FIG. 29 is a block diagram illustrating a computing system according to at least one example embodiment.

Referring to FIG. 29, computing system 1100 comprises a processor 1110, a memory device 1120, a user interface 1130, and a memory system 8000. In at least one example embodiment, computing system 1100 further comprises a modem 1140 such as a baseband chipset.

Processor 1110 executes a specific calculation or tasks. For example, processor 1110 may be a processor or a CPU. Processor 1110 may be connected to memory device 1120 through a bus 1150 such as an address bus, a control bus or a data bus. For example, memory device 1120 may be implemented with DRAM, mobile DRAM, SRAM, PRAM, FRAM, RRAM or MRAM. Further, processor 1110 may be connected to an expansion bus such as a PCI. Thus, processor 1110 may control user interface 1130 including at least one input device such as a keyboard or a mouse, and at least one out output device such as a printer or a display. Modem 1140 may wirelessly transceive data with an external apparatus. Memory device 820 may store the data processed by processor 1110 or the data received through modem 1140 through memory controller 810 therein. Computing system 1100 may further comprise a power supply for supplying an operation voltage. Further, according to at least one example embodiment of inventive concepts, computing system 1100 may further include an application chipset, and a camera image processor (CIS).

Example embodiments may be applied to, e.g., a nonvolatile memory device such as a flash memory, and various apparatuses and systems including the nonvolatile memory device. As examples, embodiments may be expansively applied to a memory card, a solid state drive, a computer, a laptop computer, a cellular phone, a smart phone, an MP3 player, a PDA, a PMP, a digital TV, a digital camera, and a portable game console.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming a memory device comprising:
   programming a low bit to a memory cell included in a word line and a bit line based on a first verification condition, the low bit belonging to a group of bits including a high bit, the first verification condition being based on at least one of a first bit line current, a first develop time for verifying the programming of the low bit, and a first word line voltage; and
   programming the high bit to the memory cell based on a second verification condition, the second verification condition being based on at least one of a second bit line current, a second develop time for verifying the programming of the high bit, and a second word line voltage, wherein
   the memory cell is included in a flash memory, the flash memory including a three-dimensional memory array.

2. The method of claim 1, wherein the programming the low bit to the memory cell includes:
   programming the low bit based on the first verification condition;
   verifying the low bit based on the first verification condition; and
   re-programming the low bit if the verification fails and returning to the verifying operation.

3. The method of claim 1, wherein the programming the high bit to the memory cell includes:
   programming the high bit based on the second verification condition;
   verifying the high bit based on the second verification condition; and
   re-programming the high bit if the verification fails and returning to the verifying operation.

4. The method of claim 1, wherein the first verification condition is based on the first bit line current that is transferred through the bit line,
   wherein the second verification condition is based on the second bit line current that is transferred through the bit line, and
   wherein an amplitude of the first bit line current is less than an amplitude of the second bit line current.

5. The method of claim 4, wherein the amplitude of the first bit line current and the amplitude of the second bit line current are based on a gate voltage of a control transistor included in a page buffer that is connected to the bit line, and
   wherein the gate voltage of the control transistor is less for providing the first bit line current than the gate voltage of the control transistor for providing the second bit line current.

6. The method of claim 1, wherein the first verification condition is based on the first develop time,
   wherein the second verification condition is based on the second develop time, and
   wherein the first develop time is less than the second develop time.

7. The method of claim 1, wherein the first verification condition is based on the first word line voltage that is provided to the word line,
   wherein the second verification condition is based on the second word line voltage that is provided to the word line, and
   wherein an amplitude of the first word line voltage is less than an amplitude of the second word line voltage.

8. A method of programming a memory device comprising:
   programming a least significant bit to a memory cell included in a word line and a bit line based on a first verification condition, the least significant bit belonging to a group of bits including a most significant bit and a central significant bit, the first verification condition being based on at least one of a first bit line current, a first develop time for verifying the programming of the least significant bit, and a first word line voltage;
   programming the central significant bit to the memory cell based on a second verification condition, the second verification condition being based on at least one of a second bit line current, a second develop time for verifying the programming of the central significant bit, and a second word line voltage; and
   programming the most significant bit to the memory cell based on a third verification condition, the third verification condition being based on at least one of a third bit line current, a third develop time for verifying the programming of the most significant bit, and a third word line voltage.

9. The method of claim 8, wherein the programming the low bit to the memory cell includes:
   programming the least significant bit based on the first verification condition;
   verifying the least significant bit based on the first verification condition; and
   re-programming the least significant bit if the verification fails and returning to the verifying operation.

10. The method of claim 8, wherein the first verification condition is based on the first bit line current that is transferred through the bit line,
    wherein the second verification condition is based on the second bit line current that is transferred through the bit line,
    wherein the third verification condition is based on the third bit line current that is transferred through the bit line, and
    wherein an amplitude of the first bit line current is less than an amplitude of the second bit line current and an amplitude of the third bit line current.

11. The method of claim 10, wherein the amplitude of the first bit line current, the amplitude of the second bit line current and the amplitude of the third bit line current are based on a gate voltage of a control transistor included in a page buffer that is connected to the bit line.

12. The method of claim 11, wherein the gate voltage of the control transistor is less for providing the first bit line current than the gate voltage of the control transistor for providing the second bit line current and the gate voltage of the control transistor for providing the third bit line current.

13. The method of claim 8, wherein the first verification condition is based on the first develop time,
    wherein the second verification condition is determined based on the second develop time,
    wherein the third verification condition is determined based on the third develop time, and wherein the first develop time is less than the second develop time and the third develop time.

14. The method of claim 8, wherein the first verification condition is based on the first word line voltage that is provided to the word line, wherein the second verification condition is based on the second word line voltage that is provided to the word line, wherein the third verification condition is based on the third word line voltage that is provided to the word line, and wherein an amplitude of the first word line voltage is less than an amplitude of the second word line voltage and an amplitude of the third word line voltage.

15. The method of claim 8, wherein the memory cell is included in a flash memory, and the flash memory includes a three-dimensional memory array.

16. A method, comprising:

verifying a first bit of data programmed to a multi-level cell of a memory using a first verification condition, the first verification condition including at least one of a first bit line current, a first verification time for verifying the first bit, and a first word line voltage; and verifying a second bit of the data programmed to the multi-level cell using a second verification condition, the second verification condition including at least one of a second bit line current, a second verification time for verifying the second bit, and a second word line voltage, wherein the memory is a flash memory, the flash memory including a three-dimensional memory array.

17. The method of claim 16, wherein the first bit line current is less than the second bit line current, the first verification time is less than the second verification time, and the first word line voltage is less than the second word line voltage.

18. The method of claim 17, wherein the second bit of data is a greater significant bit than the first bit of data.

* * * * *